(12) United States Patent
Shiraishi (10) Patent No.: US 12,081,135 B2
(45) Date of Patent: Sep. 3, 2024

(54) SEMICONDUCTOR MODULE

(71) Applicant: Mitsubishi Electric Corporation, Tokyo (JP)

(72) Inventor: Takuya Shiraishi, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 443 days.

(21) Appl. No.: 17/559,117

(22) Filed: Dec. 22, 2021

(65) Prior Publication Data
US 2022/0321022 A1 Oct. 6, 2022

(30) Foreign Application Priority Data

Mar. 30, 2021 (JP) ................................ 2021-057421

(51) Int. Cl.
| | | |
|---|---|---|
| H01L 27/24 | (2006.01) | |
| H01L 27/07 | (2006.01) | |
| H02M 7/00 | (2006.01) | |
| H02M 7/5387 | (2007.01) | |
| H10B 63/00 | (2023.01) | |

(52) U.S. Cl.
CPC ........ H02M 7/003 (2013.01); H01L 27/0772 (2013.01); H02M 7/53871 (2013.01); H10B 63/32 (2023.02)

(58) Field of Classification Search
None
See application file for complete search history.

(56) References Cited

U.S. PATENT DOCUMENTS

| | | |
|---|---|---|
| 2017/0358522 A1 | 12/2017 | Nakamura |
| 2020/0321901 A1 | 10/2020 | Araki |
| 2022/0321022 A1* | 10/2022 | Shiraishi ................. H02M 1/08 |

FOREIGN PATENT DOCUMENTS

| | | |
|---|---|---|
| JP | 2008-085277 A | 4/2008 |
| JP | 2017-220627 A | 12/2017 |
| WO | 2020/017169 A1 | 1/2020 |

OTHER PUBLICATIONS

An Office Action mailed by the Japanese Patent Office on Oct. 17, 2023, which corresponds to Japanese Application No. 2021-057421 with English translation.

* cited by examiner

*Primary Examiner* — Jack S Chen
(74) *Attorney, Agent, or Firm* — Studebaker & Brackett PC (57) ABSTRACT

A semiconductor module includes first and second switching devices and first and second control devices all sealed in a package rectangular in a plan view, signal terminals on a side surface of a first long side input signals to the first and second control devices, each of the first and second switching devices outputs one of the signals from an output terminal on a side surface of a second long side, each of the first and second control devices includes a control ground connected to a control ground terminal on the side surface of the first long side, a main power terminal and a power ground terminal are disposed on the side surface of the second long side, and the power ground terminal is electrically connected inside the package to the control ground terminal through a current detection resistor outside the package and an impedance component inside the package.

8 Claims, 7 Drawing Sheets

SEMICONDUCTOR MODULE

BACKGROUND OF THE INVENTION

Field of the Invention

The present disclosure relates to a semiconductor module, and particularly to a semiconductor module that packages power semiconductor devices and its control circuit by transfer molding.

Description of the Background Art

Semiconductor modules each of which packages switching devices such as an insulated gate bipolar transistor (IGBT) and a control device that controls driving the switching devices are referred to as Intelligent Power Modules (IPMs). In conventional IPMs, a current detection resistor that detects a main current of the switching devices, that is, a shunt resistor is connected outside the package. This shunt resistor monitors the main current to detect an abnormal operation such as occurrence of a short-circuit current, and provides short-circuit protection.

When the short-circuit current occurs, an electromagnetic force is generated by a change in a current (di/dt) when the current is interrupted, and a wiring inductance between an emitter and a power ground that is a ground of a power circuit. Thus, impedance is provided as a countermeasure against noise between the power ground and a control ground that is a ground of the control device of the semiconductor module for preventing a ground current generated by this electromagnetic force from flowing through the control ground. WO2020/017169 discloses, in FIG. 1, an example power module with this countermeasure being taken.

The power module disclosed in this document includes an external resistor with impedance for this countermeasure, and has a problem of an increase in the cost due to an increase in the number of components.

SUMMARY

The object of the present disclosure is to provide a semiconductor module which includes control devices with a countermeasure against noise being taken and in which an increase in the cost is prevented.

A semiconductor module according to the present disclosure includes: a first switching device and a second switching device that are connected in series between a main power terminal and a power ground terminal, the first switching device and the second switching device complementarily operating; a first control device controlling driving the first switching device; and a second control device controlling driving the second switching device, the first and second switching devices and the first and second control devices are sealed in a package that is rectangular in a plan view in the semiconductor module, the package has first and second long sides, and a plurality of signal terminals on a side surface of the first long side input signals to the first and second control devices, each of the first and second switching devices outputs one of the signals from an output terminal on a side surface of the second long side, each of the first and second control devices includes a control ground connected to a control ground terminal on the side surface of the first long side, the main power terminal and the power ground terminal are disposed on the side surface of the second long side, and the power ground terminal is connected to a current detection resistor disposed outside the package, and is electrically connected inside the package to the control ground terminal through the current detection resistor and an impedance component disposed inside the package. In the semiconductor module according to the present disclosure, the power ground terminal is electrically connected inside the package to the control ground terminal through the current detection resistor disposed outside the package and the impedance component disposed inside the package. Thus, a countermeasure against noise can be taken by setting an impedance of the impedance component so that a frequency of the electromagnetic force caused by a short-circuit current in a switching device can be removed. Furthermore, provision of the impedance component inside the package can prevent an increase in the cost.

These and other objects, features, aspects and advantages of the present invention will become more apparent from the following detailed description of the present invention when taken in conjunction with the accompanying drawings.

DESCRIPTION OF THE PREFERRED EMBODIMENTS

Introduction

Figure 7:
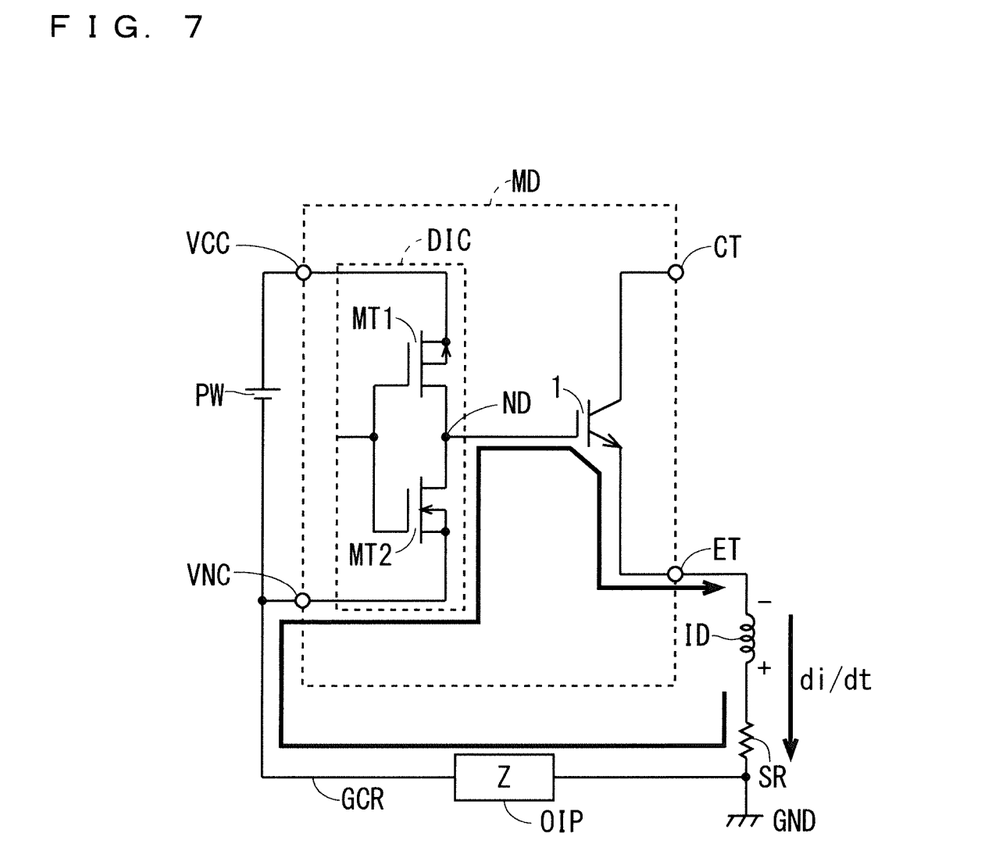
FIG. 7 illustrates a countermeasure against noise in a semiconductor module.

Before describing Embodiments, a countermeasure against noise caused by the short-circuit current will be described. FIG. 7 is a circuit diagram illustrating a circuit structure of a semiconductor module MD that packages only an IGBT 1 and a driving circuit DIC that controls driving the IGBT 1, as an example semiconductor module with the countermeasure being taken.

As illustrated in FIG. 7, the IGBT 1 is connected between a collector terminal CT and an emitter terminal ET, and the gate of the IGBT 1 is connected to an output node ND of the driving circuit DIC in the semiconductor module MD.

The driving circuit DIC includes a gate driver including a p-channel MOS transistor MT1 and an n-channel MOS transistor MT2 that are connected in series between a control ground terminal VNC and a drive voltage terminal VCC to which a DC power supply PW applies a drive voltage. The connection node of these two transistors is the output node ND. The description of structures of the driving circuit DIC other than the gate driver is omitted for convenience.

The emitter of the IGBT 1 is connected to one terminal of a shunt resistor SR through the emitter terminal ET. The other terminal of the shunt resistor SR is connected to a power ground GND, and to the control ground terminal VNC through an external resistor OIP. The wiring for connecting the control ground terminal VNC to the power ground GND is referred to as gate charge return wiring GCR.

When a short-circuit current occurs in a switching device, an electromagnetic force is generated by a change in a current (di/dt) when the current is interrupted, and a wiring inductance ID between the emitter terminal ET and the power ground GND as previously described. When a ground current induced by this electromagnetic force flows through the control ground terminal VNC of the driving circuit DIC, the n-channel MOS transistor MT2 is subject to noise. Thus, the external resistor OIP is connected between the power ground GND and the control ground terminal VNC to increase an impedance Z. The gate charge return wiring GCR is a charging/discharging path for charging or discharging the gate of the IGBT 1, which is illustrated by an arrow. Since the charging/discharging path includes the n-channel MOS transistor MT2, the external resistor OIP increases the impedance Z and reduces noise.

Embodiment 1

Figure 1:
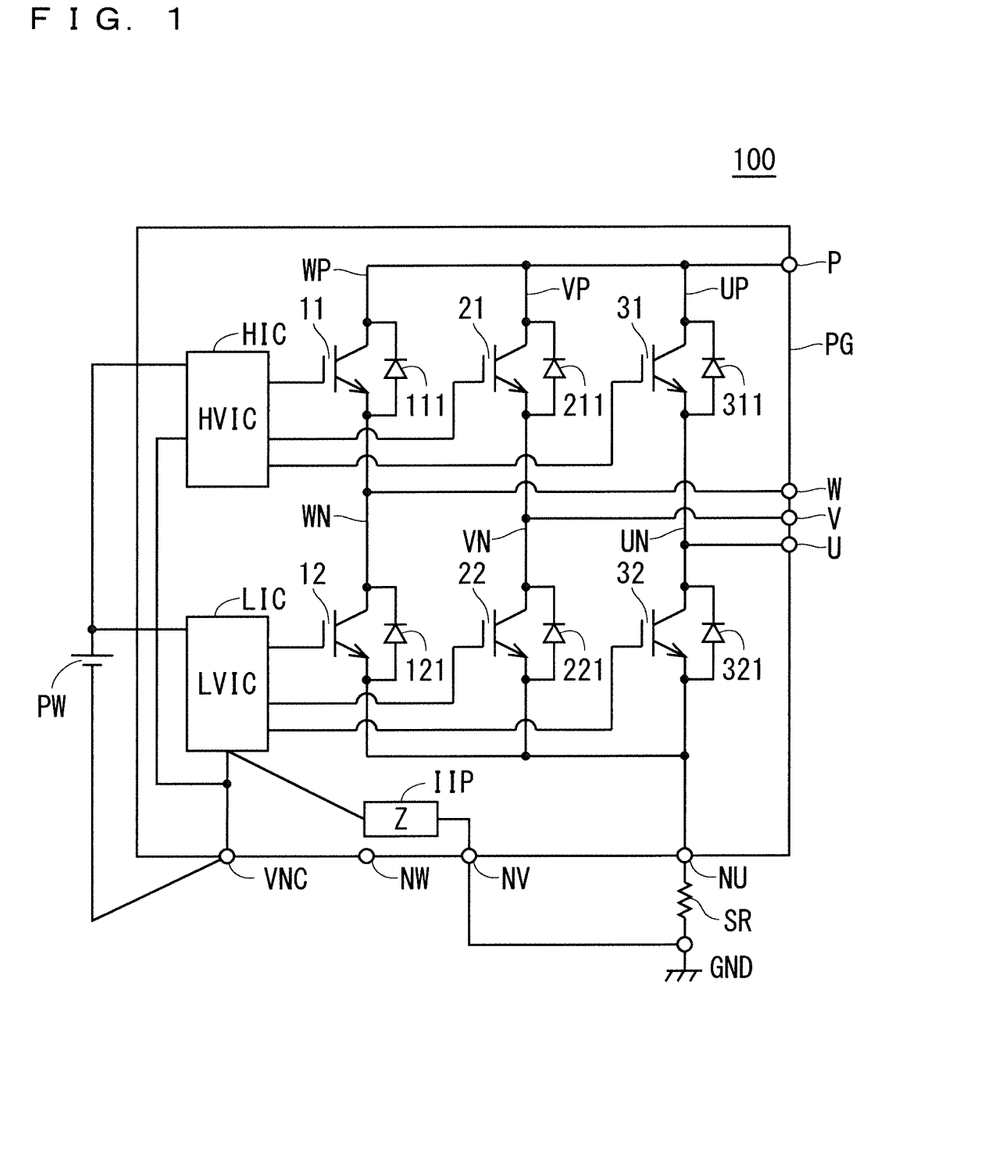
FIG. 1 illustrates a structure of an inverter module according to Embodiment 1.
Figure 2:
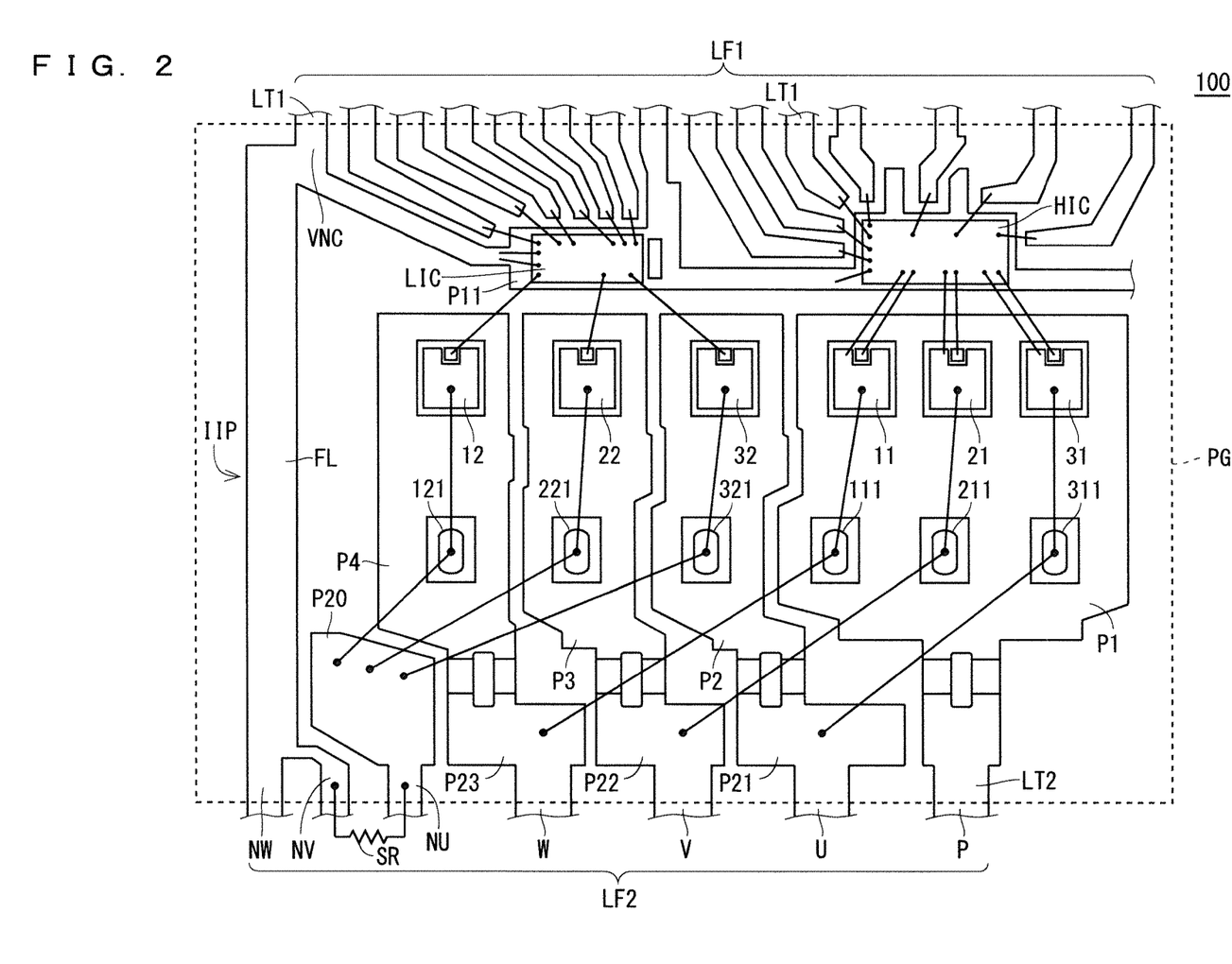
FIG. 2 is an internal wiring diagram illustrating the structure of the inverter module according to Embodiment 1.

Next, a structure of a semiconductor module according to Embodiment 1 will be described with reference to FIGS. 1 and 2. FIG. 1 illustrates a structure of a three-phase full-bridge inverter module 100. FIG. 2 is an internal wiring diagram of the inverter module 100. Both of FIGS. 1 and 2 illustrate only the main portions. FIG. 2 illustrates a region for a package PG with a broken line.

As illustrated in FIG. 1, the inverter module 100 is an Intelligent Power Module (IPM) in which switching devices and control circuits that control driving the switching devices are sealed by a resin. Furthermore, the inverter module 100 has a Dual-In-line Package (DIP) structure having two terminal rows along the long sides of the package PG as illustrated in FIG. 2.

As illustrated in FIG. 1, a pair of IGBTs 11 and 12, a pair of IGBTs 21 and 22, and a pair of IGBTs 31 and 32, all of which are of n-channel, are connected in series between a terminal P that is a high-potential main power terminal and a terminal NU that is a power ground terminal in the inverter module 100, and have connection nodes connected to a W-phase output terminal W, a V-phase output terminal V, and a U-phase output terminal U, respectively, in the package PG. The output terminals U, V, and W are connected to, for example, phases of a three-phase motor.

Freewheeling diodes 111, 121, 211, 221, 311, and 321 are anti-parallel connected to the IGBTs 11, 12, 21, 22, 31, and 32, respectively. Furthermore, a control device HIC is disposed to control the IGBTs 11, 21, and 31 that are high-potential first switching devices. The control device HIC is a High Voltage Integrated Circuit (HVIC), and transmits a control output signal to each gate electrode of the IGBTs 11, 21, and 31.

Furthermore, a control device LIC is disposed in the inverter module 100 to control the IGBTs 12, 22, and 32 that are low-potential second switching devices. The control device LIC is a Low Voltage Integrated Circuit (LVIC), and transmits a control output signal of the control device LIC to each gate electrode of the IGBTs 12, 22, and 32. Here, the control devices HIC and LIC operate according to a drive voltage from a DC power supply PW. The control grounds of the control devices HIC and LIC are connected in common to a control ground terminal VNC.

The emitters of the IGBTs 12, 22, and 32 are connected to one terminal of an outboard shunt resistor SR through a terminal NU. The other terminal of the shunt resistor SR is connected to a power ground GND and to a terminal NV. The terminal NV is electrically connected to the control ground of the control device LIC through an impedance component IIP disposed in the inverter module 100.

Here, a specific structure of the inverter module 100 will be described with reference to FIG. 2. As illustrated in FIG. 2, the inverter module 100 includes a lead frame LF1 on which the control devices LIC and HIC are mounted along the first long side of the rectangular package PG, and a lead frame LF2 on which the IGBTs and the freewheeling diodes are mounted along the second long side of the package PG.

The lead frame LF1 includes a plurality of lead terminals LT1 that are signal terminals, and a die pad P11 on which the control devices LIC and HIC are mounted.

The die pad P11 extends parallel to the long sides of the package PG, and is connected to any of the lead terminals LT1. The control devices LIC and HIC mounted on the die pad P11 are connected to the lead terminals LT1 by wire bonding, and receive various signals and drive voltages through the lead terminals LT1.

The lead frame LF2 includes seven lead terminals LT2, die pads P1 to P4, and wire bonding regions P20 to P23.

The die pads P1 to P4 are arranged in parallel with the long sides of the package PG, and are independent from each other. The die pads P2 to P4 are arranged integrally with the wire bonding regions P21 to P23, respectively. The lead terminal LT2 is connected integrally to each of the wire bonding regions P21 to P23. Furthermore, the lead terminal LT2 is connected integrally to each of the die pad P1 and the wire bonding region P20. The wire bonding regions P20 to P23 are arranged in parallel with the long sides of the package PG.

Here, the lead terminal LT2 integrated with the die pad P1 corresponds to the terminal P in FIG. 1. The lead terminals LT2 integrated with the wire bonding regions P21, P22, and P23 correspond to the output terminals U, V, and W, respectively. The lead terminal LT2 integrated with the wire bonding region P20 corresponds to the terminal NU.

In FIG. 2, the IGBTs 11, 21, and 31 are disposed on the die pad P1 to face the control device HIC in an end portion of the lead frame LF1 side. The IGBTs 32, 22, and 12 are disposed on the die pads P2, P3, and P4, respectively, to face the control device LIC in the end portion of the lead frame LF1 side.

Furthermore, the freewheeling diodes 111, 211, and 311 are disposed on the die pad P1 to face the IGBTs 11, 21, and 31, respectively. The freewheeling diodes 321, 221, and 121 are disposed on the die pads P2, P3, and P4 to face the IGBTs 32, 22, and 12, respectively.

The IGBTs herein are IGBTs with vertical structures in which the main current flows perpendicular to the principal surface of a semiconductor substrate. A surface in contact with the principal surface of the die pad is a collector, and the opposite surface thereof is an emitter. Each of the IGBTs includes a gate pad in the plain closer to the emitter.

Furthermore, the freewheeling diodes herein are diodes with vertical structures in which the main current flows perpendicular to the principal surface of the semiconductor substrate. A surface in contact with the principal surface of the die pad is a cathode, and the opposite surface thereof is an anode.

The gate pad and the emitter of each of the IGBTs 11, 21, and 31 are connected to the control device HIC by wire bonding. The emitters of the IGBTs 11, 21, and 31 are connected to the anodes of the freewheeling diodes 111, 211, and 311, respectively, by wire bonding.

The gate pad of each of the IGBTs 12, 22, and 32 is connected to the control device LIC by wire bonding. The emitters of the IGBTs 12, 22, and 32 are connected to the cathodes of the freewheeling diodes 121, 221, and 321, respectively, by wire bonding.

The anodes of the freewheeling diodes 111, 211, and 311 are connected to the wire bonding regions P23, P22, and P21, respectively, by wire bonding. The anodes of the freewheeling diodes 121, 221, and 321 are connected in common to the wire bonding region P20 by wire bonding.

The lead terminals LT2 corresponding to the terminals NV and NW that are unused terminals in FIG. 1 are connected in common to a frame component FL as the impedance component IIP inside the package PG, as illustrated in FIG. 2. The lead terminals LT2 corresponding to the terminals NU and NV in FIG. 1 are connected to the outboard shunt resistor SR as illustrated in FIG. 2.

The frame component FL is disposed in parallel with the short sides of the package PG to connect the lead frame LF1 to the lead frame LF2, and is connected to the lead terminal LT1 corresponding to the control ground terminal VNC illustrated in FIG. 1 on the lead frame LF1 side.

The impedance of the impedance component IIP that is the frame component FL is an impedance having frequency characteristics allowing to remove a frequency of the electromagnetic force generated by a change in a current (di/dt) when the current is interrupted upon occurrence of the short-circuit current in a switching device, and a wiring inductance between an emitter and a power ground. The peak electromagnetic force to be generated is set to a value lower than or equal to an allowable voltage, for example, a gate breakdown voltage of the IGBT or a device breakdown voltage of the control devices LIC and HIC.

The frequency of the electromagnetic force generated by the short-circuit current occurring in a switching device in a semiconductor module such as the switching device in the inverter module 100 can be calculated from, for example, a rating of the switching device. When the semiconductor module is designed, the width of the frame component FL should be set so that semiconductor module has an impedance that can remove the calculated frequency of the electromagnetic force. Thus, an increase in the cost of having the impedance component IIP can be prevented.

Ferrite beads typically used for a countermeasure against noise have inductance components and resistance components. The inductance components mainly function in a low frequency region to reflect noise, whereas the resistance components mainly function in a high frequency region to absorb noise. Thus, adjusting the resistance components, that is, the impedance in the high frequency region enables removal of particular frequency components.

As such, the impedance component IIP is used as a part of the gate charge return wiring for connecting the control ground terminal VNC to the power ground GND in the inverter module 100. The inverter module 100 does not need an external resistor. Thus, an increase in the cost due to addition of an external resistor can be prevented. Since the impedance component IIP is disposed inside the module, the footprint of the module can be reduced more than that of a module including an external resistor.

Embodiment 2

Figure 3:
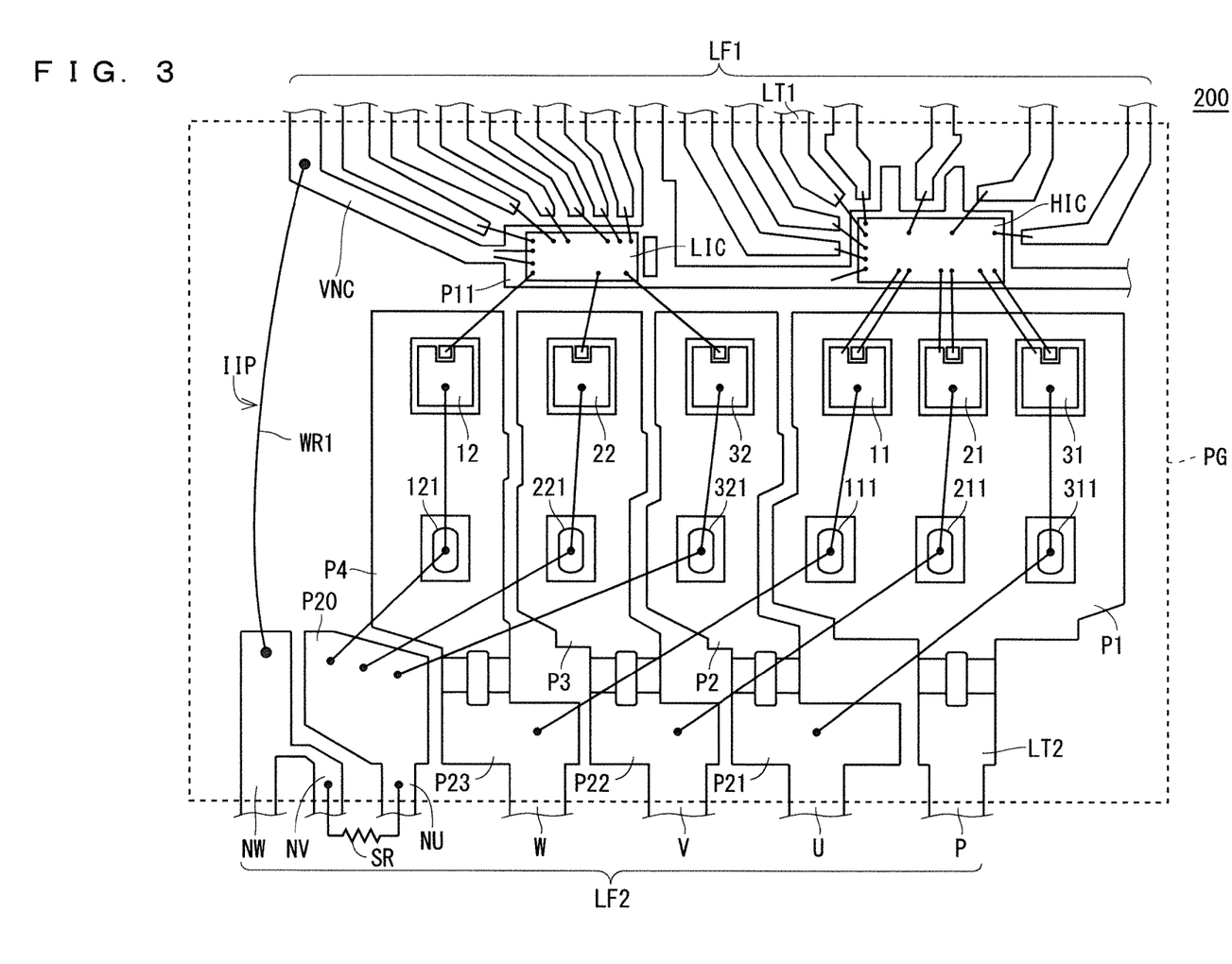
FIG. 3 is an internal wiring diagram illustrating a structure of an inverter module according to Embodiment 2.

Next, a structure of a semiconductor module according to Embodiment 2 will be described with reference to FIG. 3. FIG. 3 is an internal wiring diagram of a three-phase full-bridge inverter module 200. The same reference numerals are used for the same structures as those of the inverter module 100 described with reference to FIG. 2, and the overlapping description will be omitted. The circuit structure of the inverter module 200 is the same as that of the inverter module 100 in FIG. 1.

As illustrated in FIG. 3, the lead terminals LT2 corresponding to the terminals NV and NW in FIG. 1 are connected in common inside the package PG to the lead terminal LT1 corresponding to the control ground terminal VNC of FIG. 1 in the lead frame LF1 by wire bonding through a wire WR1 that is the impedance component IIP.

As such, the wire WR1 is used as a part of the gate charge return wiring for connecting the control ground terminal VNC to the power ground GND in the inverter module 200. The inverter module 200 does not need an external resistor. Thus, an increase in the cost due to addition of an external resistor can be prevented. Since the impedance component IIP is disposed inside the module, the footprint of the module can be reduced more than that of a module including an external resistor.

Furthermore, existing frames can be used as the lead frames LF1 and LF2. Since there is no need to process the existing frames, an increase in the cost of preparing the impedance component IIP can be prevented.

Since the wire WR1 is used as the impedance component IIP, the resistance value can be increased by the contact resistance between the wire WR1 and the frames more than that in the structure using the frame component FL in FIG. 2. The wire WR1 is looped in wire bonding. Thus, the wire WR1 used as the impedance component IIP is longer than that of the rectilinear frame component FL in FIG. 2, which can increase the resistance value.

The wire WR1 can be made of aluminum or gold. Thus, the impedance can be adjusted by changing the material of the wire WR1.

Embodiment 3

Figure 4:
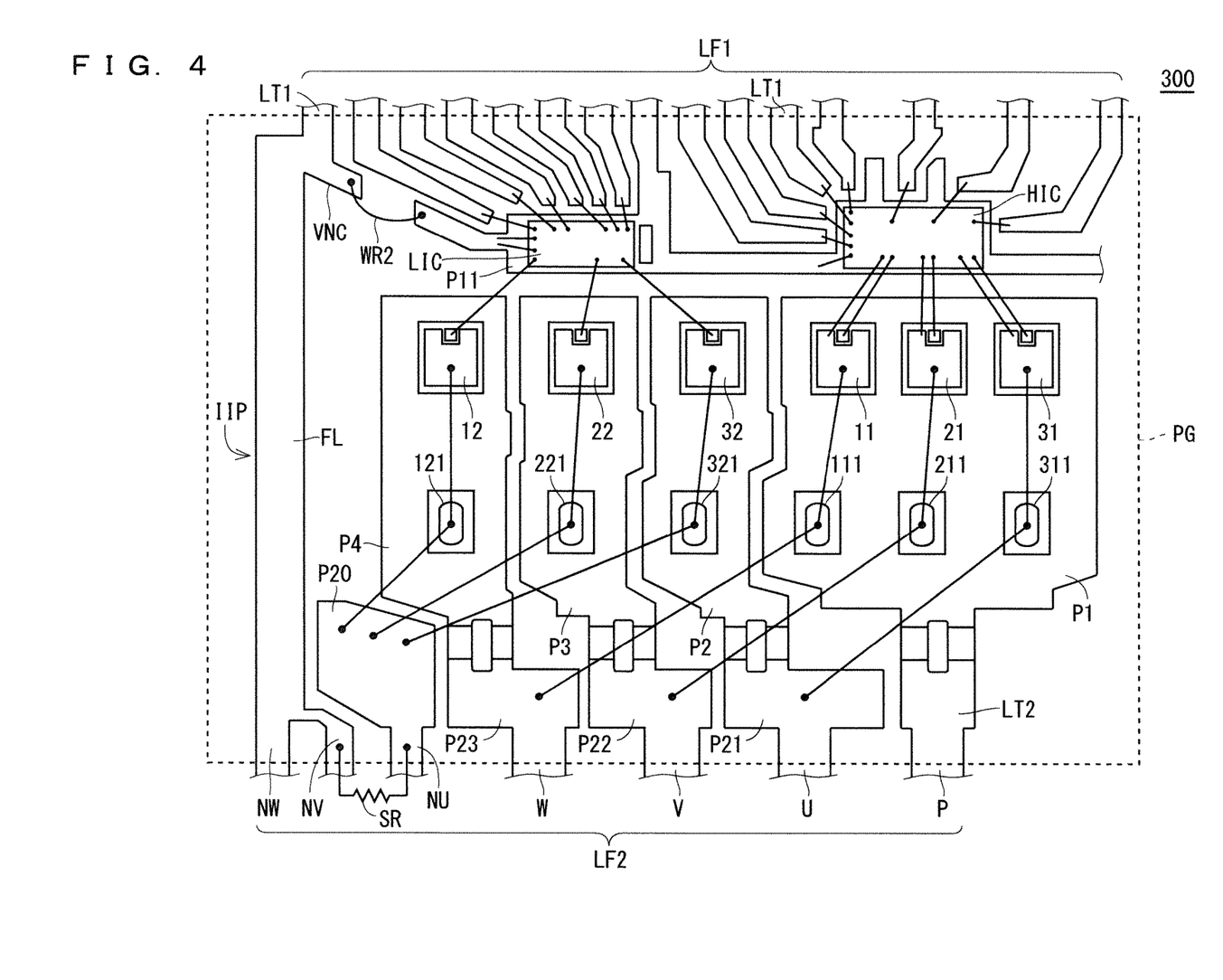
FIG. 4 is an internal wiring diagram illustrating a structure of an inverter module according to Embodiment 3.

Next, a structure of a semiconductor module according to Embodiment 3 will be described with reference to FIG. 4. FIG. 4 is an internal wiring diagram of a three-phase full-bridge inverter module 300. The same reference numerals are used for the same structures as those of the inverter module 100 described with reference to FIG. 2, and the overlapping description will be omitted. The circuit structure of the inverter module 300 is the same as that of the inverter module 100 in FIG. 1.

As illustrated in FIG. 4, the lead terminals LT2 corresponding to the terminals NV and NW in FIG. 1 are connected in common inside the package PG to the frame component FL included in the impedance component IIP in the inverter module 300.

The frame component FL is disposed in parallel with the short sides of the package PG to connect the lead frame LF1 to the lead frame LF2, and is connected to the lead terminal LT1 corresponding to the control ground terminal VNC illustrated in FIG. 1 on the lead frame LF1 side. However, the lead terminal LT1 is partly cut away to be isolated from the die pad P11 on which the control devices LIC and HIC are mounted. The lead terminal LT1 partly cut away is electrically connected to the die pad P11 through a wire WR2. Thus, the impedance component IIP includes the frame component FL and the wire WR2.

As such, the impedance component IIP is used as a part of the gate charge return wiring for connecting the control ground terminal VNC to the power ground GND in the inverter module 300. The inverter module 300 does not need an external resistor. Thus, an increase in the cost due to addition of an external resistor can be prevented. Since the impedance component IIP is disposed inside the module, the footprint of the module can be reduced more than that of a module including an external resistor.

Partly cutting away the lead terminal LT1 to be isolated from the die pad P11 and electrically connecting the lead terminal LT1 partly cut away to the die pad P11 through the wire WR2 can increase the resistance value by the contact resistance between the wire WR2 and the frames more than that using the frame component FL solely as the impedance component IIP. Fine adjustments of the length of the wire WR2 allow fine adjustments of the impedance of the impedance component IIP.

The wire WR2 can be made of aluminum or gold. Thus, the impedance can be adjusted by changing the material of the wire WR2.

Embodiment 4

Figure 5:
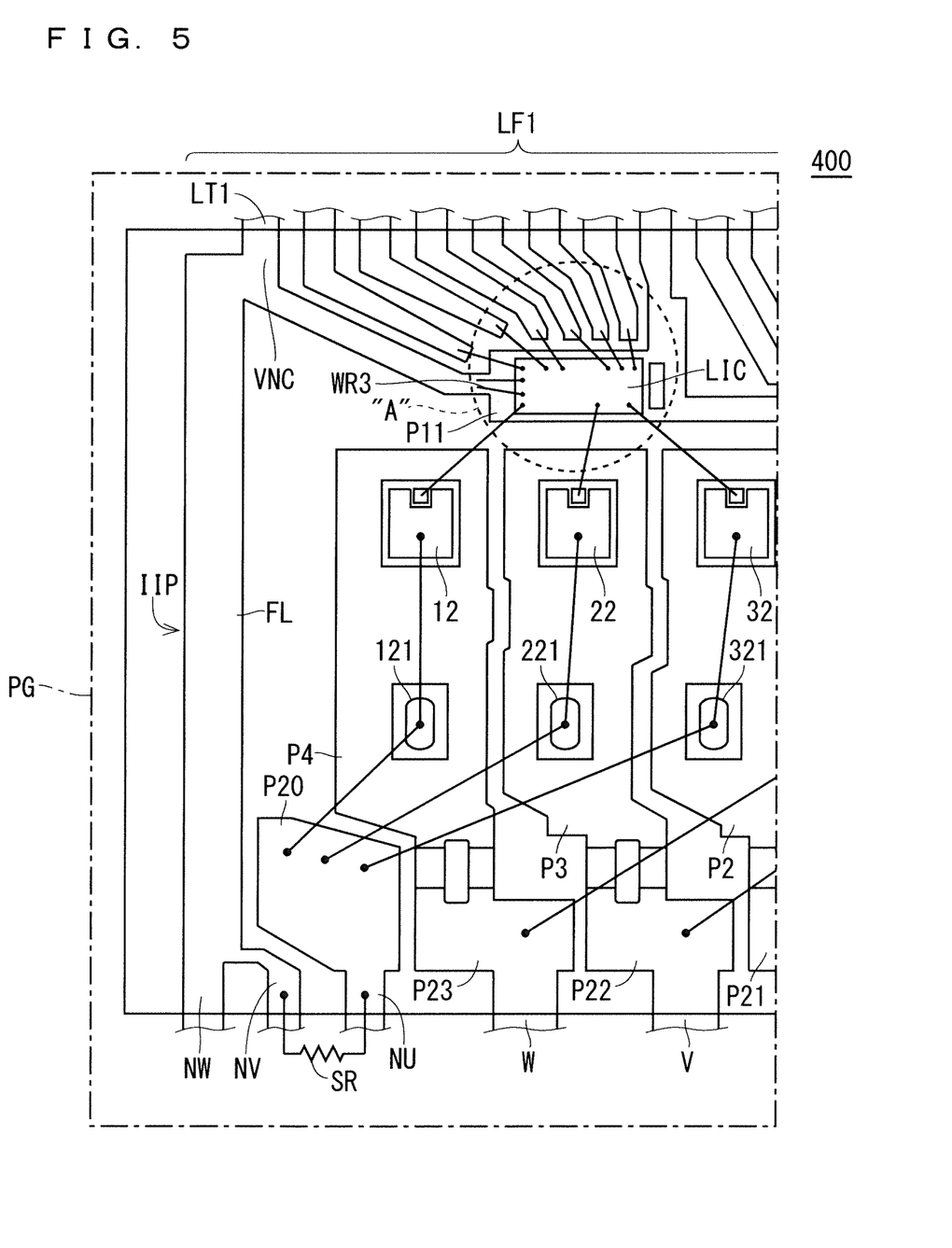
FIG. 5 is an internal wiring diagram illustrating a structure of an inverter module according to Embodiment 4.

Next, a structure of a semiconductor module according to Embodiment 4 will be described with reference to FIGS. 5 and 6. FIG. 5 is an internal wiring diagram of a three-phase full-bridge inverter module 400. The same reference numerals are used for the same structures as those of the inverter module 100 described with reference to FIG. 2, and the overlapping description will be omitted. The circuit structure of the inverter module 400 is the same as that of the inverter module 100 in FIG. 1.

As illustrated in FIG. 5, the lead terminals LT2 corresponding to the terminals NV and NW in FIG. 1 are connected in common inside the package PG to the frame component FL included in the impedance component IIP in the inverter module 400.

The frame component FL is disposed in parallel with the short sides of the package PG to connect the lead frame LF1 to the lead frame LF2, and is connected to the lead terminal LT1 corresponding to the control ground terminal VNC illustrated in FIG. 1 on the lead frame LF1 side.

The tip of the lead terminal LT1 is integrated with the die pad P11 on which the control devices LIC and HIC are mounted, and is electrically connected to the control device LIC through a wire WR3 such as a gold wire. FIG. 6 is an enlarged view of a region A including the control device LIC in FIG. 5.

Figure 6:
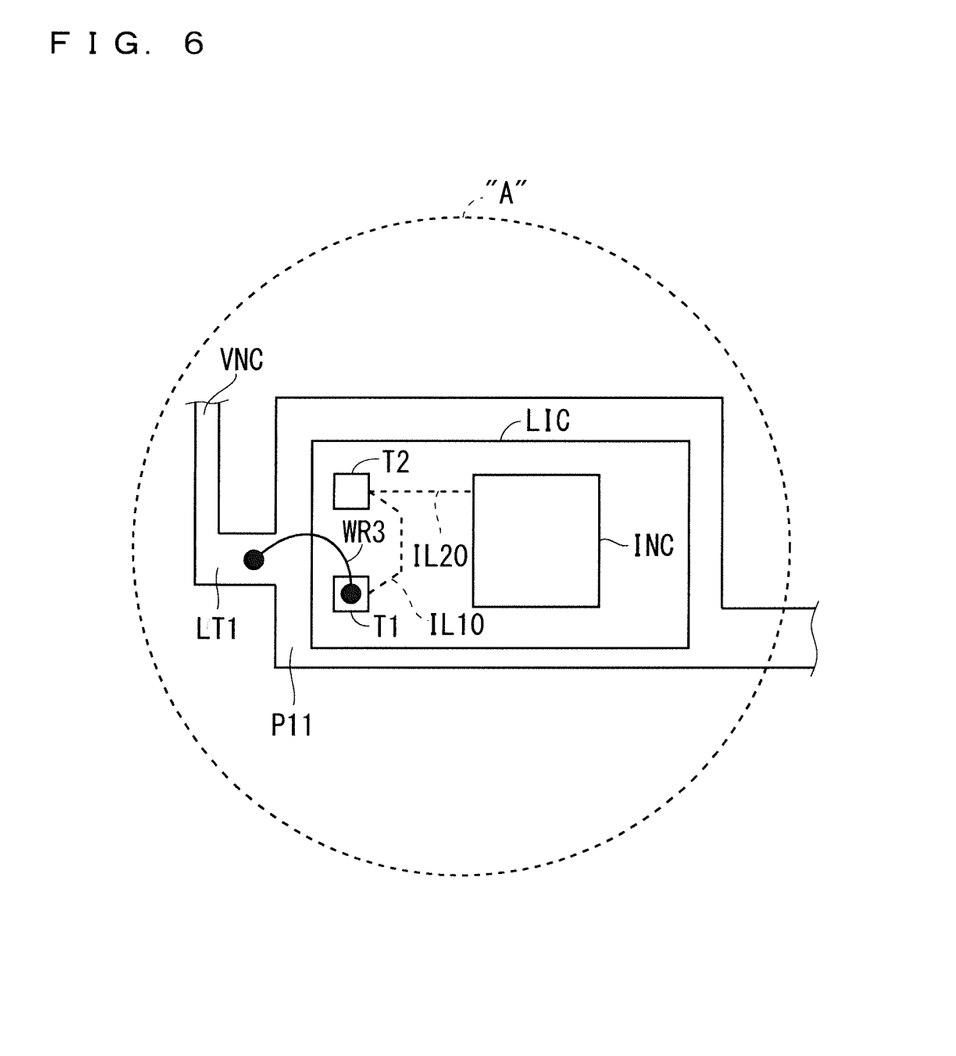
FIG. 6 is a partial enlarged view of the inverter module according to Embodiment 4.

As illustrated in FIG. 6, the wire WR3 is connected to an upper surface terminal T1 of the control device LIC by wire bonding. The upper surface terminal T1 is a terminal that connects an internal circuit INC of the control device LIC to the control ground terminal VNC, and is electrically connected to an adjacent upper surface terminal T2 through an aluminum interconnection IL10 inside the control device LIC. The upper surface terminal T2 is electrically connected to the internal circuit INC through an aluminum interconnection IL20.

As such, the impedance component IIP includes the frame component FL, and the internal circuit INC inside the control device LIC is electrically connected to the control ground terminal VNC through the aluminum interconnections IL10 and IL20. Addition of the impedance of the aluminum interconnections IL10 and IL20 substantially increases the impedance of the impedance component IIP. Thus, the aluminum interconnections IL10 and IL20 can be regarded as a part of the impedance component IIP.

As such, the impedance component IIP is used as a part of the gate charge return wiring for connecting the control ground terminal VNC to the power ground GND in the inverter module 400. The inverter module 400 does not need an external resistor. Thus, an increase in the cost due to addition of an external resistor can be prevented. Since the impedance component IIP is disposed inside the module, the footprint of the module can be reduced more than that of a module including an external resistor.

Furthermore, the electrical connection of the internal circuit INC to the control ground terminal VNC through the aluminum interconnections IL10 and IL20 inside the control device LIC adds the impedance of the aluminum interconnections IL10 and IL20, which can consequently increase the impedance of the impedance component IIP.

Within the scope of the present disclosure, Embodiments can be freely combined, and appropriately modified or omitted.

While the invention has been shown and described in detail, the foregoing description is in all aspects illustrative and not restrictive. It is therefore understood that numerous modifications and variations can be devised without departing from the scope of the invention.

What is claimed is:
1. A semiconductor module, comprising:
a first switching device and a second switching device that are connected in series between a main power terminal and a power ground terminal, the first switching device and the second switching device complementarily operating;
a first control device controlling driving the first switching device; and
a second control device controlling driving the second switching device,
wherein the first and second switching devices and the first and second control devices are sealed in a package that is rectangular in a plan view in the semiconductor module,
the package has first and second long sides, and a plurality of signal terminals on a side surface of the first long side input signals to the first and second control devices,
each of the first and second switching devices outputs one of the signals from an output terminal on a side surface of the second long side,
each of the first and second control devices includes a control ground connected to a control ground terminal on the side surface of the first long side,
the main power terminal and the power ground terminal are disposed on the side surface of the second long side, and
the power ground terminal is connected to a current detection resistor disposed outside the package, and is electrically connected inside the package to the control ground terminal through the current detection resistor and an impedance component disposed inside the package.

2. The semiconductor module according to claim 1, wherein the impedance component includes a frame component connecting, inside the package, an unused terminal on the side surface of the second long side to the control ground terminal, and
the current detection resistor is connected to the unused terminal outside the package.

3. The semiconductor module according to claim 1, wherein the impedance component includes a wire connecting, inside the package, an unused terminal on the side surface of the second long side to the control ground terminal, and the current detection resistor is connected to the unused terminal outside the package.

4. The semiconductor module according to claim 1, wherein the impedance component includes:
a frame component connecting, inside the package, an unused terminal on the side surface of the second long side to the control ground terminal; and
a wire electrically connecting the control ground terminal partly cut away to the control ground of the second control device, and
the current detection resistor is connected to the unused terminal outside the package.

5. The semiconductor module according to claim 3, wherein the wire is made of aluminum or gold.

6. The semiconductor module according to claim 1, wherein the impedance component includes:
a frame component connecting, inside the package, an unused terminal on the side surface of the second long side to the control ground terminal; and
an internal interconnection disposed inside the second control device and connecting an internal circuit of the second control device to the control ground terminal, and
the current detection resistor is connected to the unused terminal outside the package.

7. The semiconductor module according to claim 6, wherein the internal interconnection is made of aluminum.

8. The semiconductor module according to claim 4, wherein the wire is made of aluminum or gold.

* * * * *